US006674308B2

(12) United States Patent
Henderson et al.

(10) Patent No.: US 6,674,308 B2
(45) Date of Patent: Jan. 6, 2004

(54) LOW POWER WIRED OR

(75) Inventors: Alex E. Henderson, Hillsborough, CA (US); Walter E. Croft, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 10/014,821

(22) Filed: Nov. 9, 2001

(65) Prior Publication Data

US 2002/0093347 A1 Jul. 18, 2002

Related U.S. Application Data

(60) Provisional application No. 60/247,588, filed on Nov. 9, 2000.

(51) Int. Cl.[7] .............................................. H03K 19/094
(52) U.S. Cl. ........................ 326/114; 326/104; 326/125
(58) Field of Search ................................ 326/104, 114, 326/125

(56) References Cited

U.S. PATENT DOCUMENTS 5,459,411 A  * 10/1995 Nakaigawa ................... 326/21
5,646,897 A  *  7/1997 Yukutake et al. ............ 365/205

* cited by examiner

Primary Examiner—Anh Tran
(74) Attorney, Agent, or Firm—Blakely, Sokoloff, Taylor & Zafman LLP

(57) ABSTRACT

A low power wired OR circuit of the present invention comprises a plurality of logic blocks for pulling a wired OR signal line low in response to certain conditions, a differential pair of lines, such as the wired OR signal line and a reference signal line, and a sensing device coupled to the reference signal line and the wired OR signal line to receive the wired OR signal and the reference signal respectively and to detect a difference between the two signals. Having a differential pair of lines is advantageous because it maintains noise immunity for small voltage swings on the wired OR signal line, thereby reducing power dissipation in the wired OR circuit. A common current source coupled to each logic block through a common return path allows the low power wired OR circuit to control a discharge rate at which the wired OR line discharges.

25 Claims, 8 Drawing Sheets

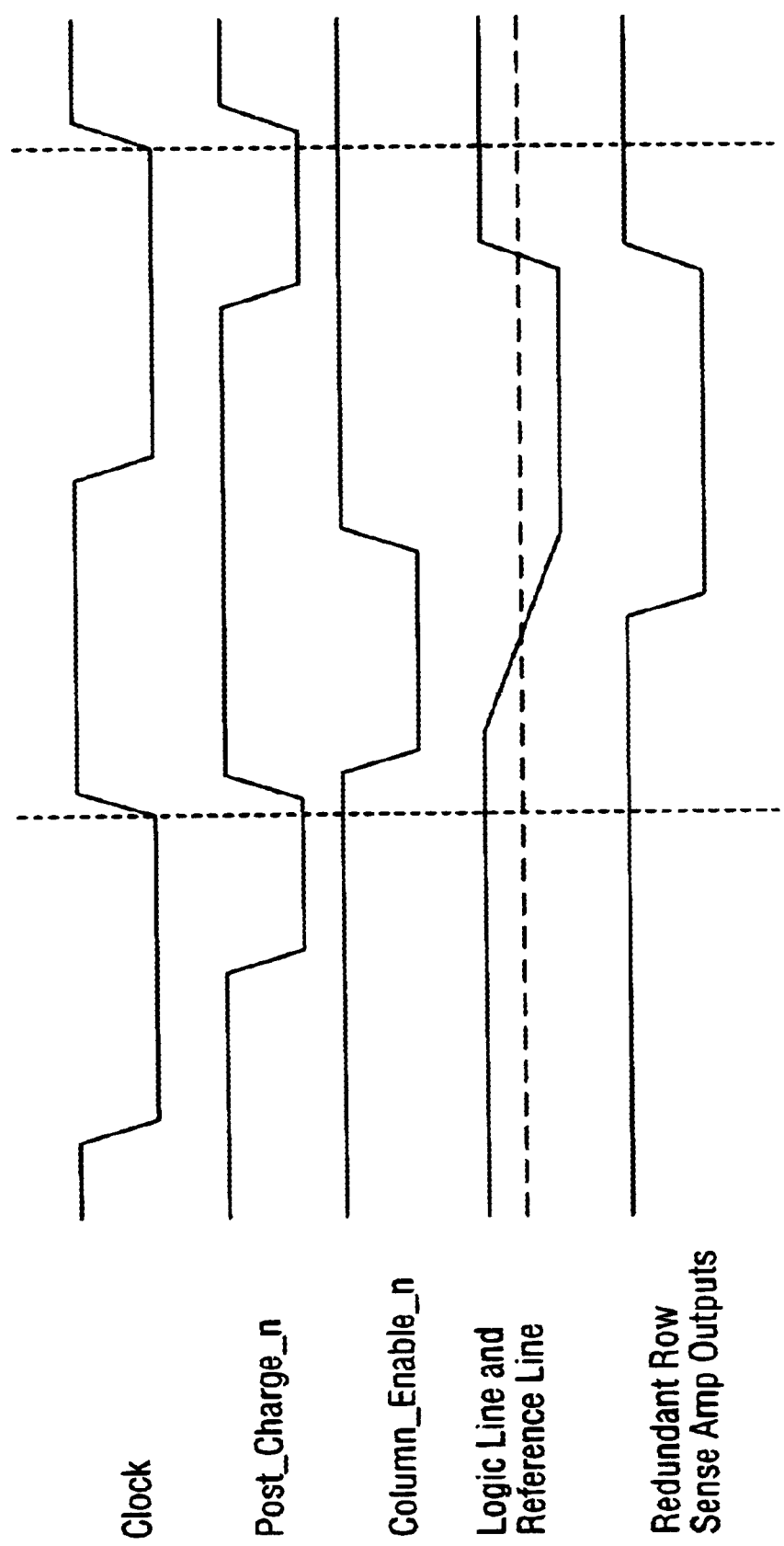

LOW POWER WIRED OR

RELATED APPLICATION

The subject matter of the present application is related to and claims priority, under 35 U.S.C. § 119(e), from U.S. provisional patent application serial No. 60/247,588, entitled "Low Power Wired OR" by Alex E. Henderson and Walter Croft, which application was filed on Nov. 9, 2000, and is incorporated herein by reference.

BACKGROUND

A. Technical Field

The present invention relates generally to wired OR functions in array computations and more specifically to a low power wired OR circuit.

B. Background of the Invention

Content addressable memory (CAM) devices, boundary addressable memory (BAM) devices and priority resolution circuits all incorporate wired OR functions. In the CAM circuit, a match circuit employs a wired OR horizontal result line. In the BAM circuit, "greater than" and "less than" circuits both employ a wired OR signal line (greater than line and less than line respectively). Wired OR functions contribute substantially to power dissipation and speed limitations.

Referring now to FIG. 1, there is shown a prior art wired OR circuit 100. Wired OR circuit 100 comprises a plurality of logic blocks 102. Each logic block 102 is coupled to a driver circuit 113 to receive an input signal. Each logic block 102 comprises a logic circuit (not shown) for pulling a wired OR signal line 108 low in response to certain conditions. Pre-charge circuit 104 is used for pre-charging the wired OR line 108 to a high voltage from ground 106. When asserting a signal on the wired OR signal line 108, each logic block 102 draws current from wired OR 108 line until wired OR line 108 is fully discharged to ground 106. One disadvantage of this setup is that it creates a high voltage swing on wired OR 108 line, thereby providing high power dissipation.

Furthermore, relative switching speed of wired OR line 108 is not controllable since there may be one to all the logic blocks 102 pulling line 108 low. For example, when many logic blocks 102 pull down wired OR line 108, wired OR line 108 discharges to ground 106 almost instantly. In such a case, the transition speed of line 108 is very fast. Conversely, when only one logic block 102 pulls wired OR line 108 down, the transition speed of line 108 is slow and the wired OR 108 does not discharge to ground 106 as fast when only a single logic block is pulling signal line 108 low. The variation in transition time makes it very difficult to implement circuits that limit the voltage swing as well as to limit the power consumed by wired OR signal line 108.

Accordingly, there is a need for a circuit that limits power dissipation and has a predictable transition speed. It is also desirable to have an electrical circuit that is not prone to electrical noise.

SUMMARY OF THE INVENTION

The present invention overcomes the deficiencies and limitations of the prior art with a low power wired logic circuit that reduces voltage swing on a wired OR signal line. A low power wired OR circuit in one embodiment of the present invention comprises a plurality of logic blocks for pulling a wired OR signal line low in response to certain conditions, a differential pair of lines, such as the wired OR signal line and a reference signal line, and a sensing device coupled to the reference signal line and the wired OR signal line to receive the wired OR signal and the reference signal respectively and to detect a difference between the two signals. Having a differential pair of lines is advantageous because it maintains noise immunity for small voltage swings on the wired OR line, thereby reducing power dissipation in the wired OR circuit.

Low power wired OR circuit further comprises a common current return line coupled to each individual logic block to connect each block to common current source. Running current through a common current source to ground rather than directly to ground advantageously allows the low power wired OR circuit to control a discharge rate at which the wired OR line discharges.

BRIEF DESCRIPTION OF THE DRAWINGS

FIG. 8 is a timing diagram of the embodiment of FIG. 7.

DETAILED DESCRIPTION OF THE PREFERRED EMBODIMENTS

Figure 1:
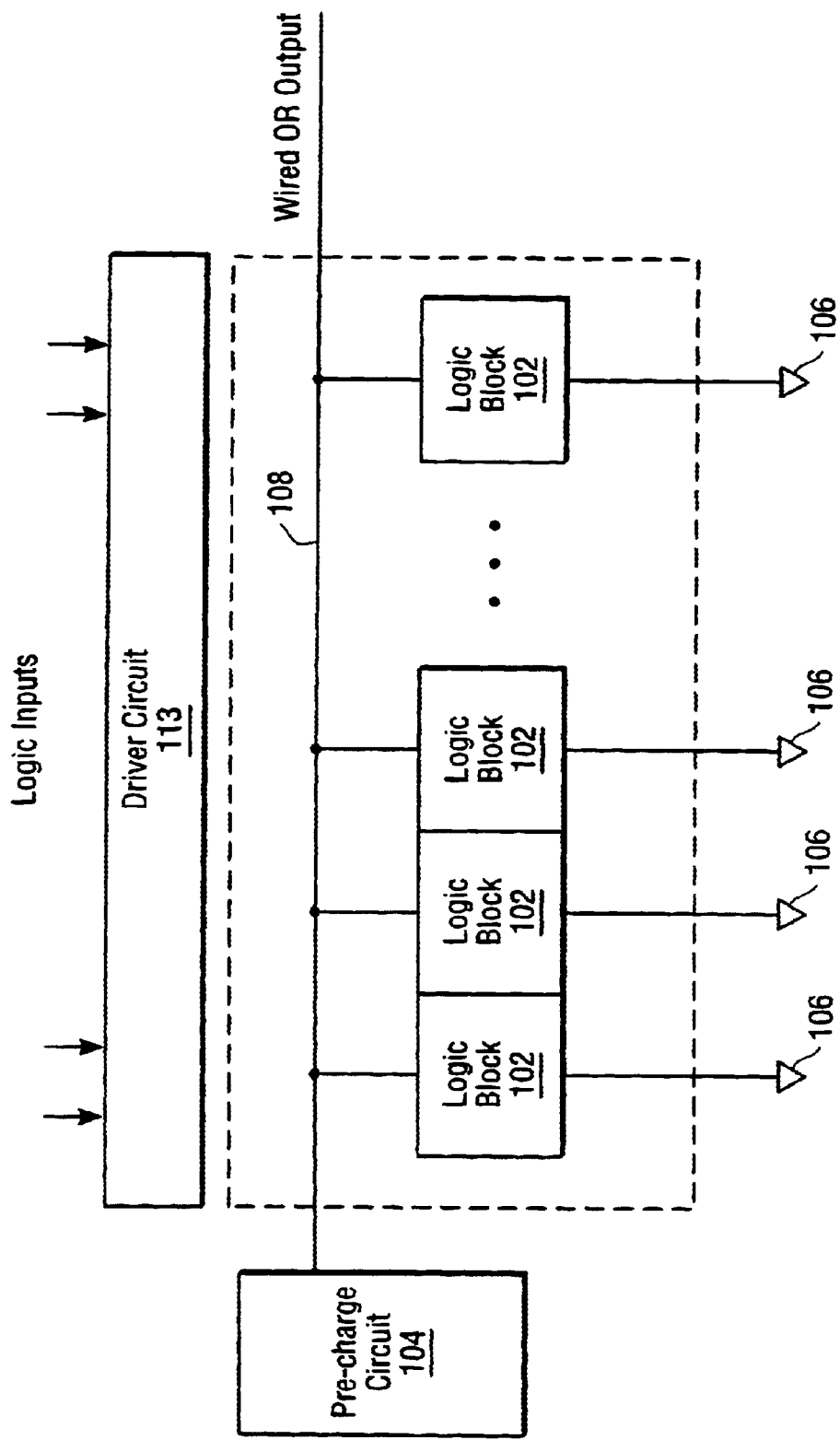
FIG. 1 is a block diagram of a prior art wired OR circuit.
Figure 2:
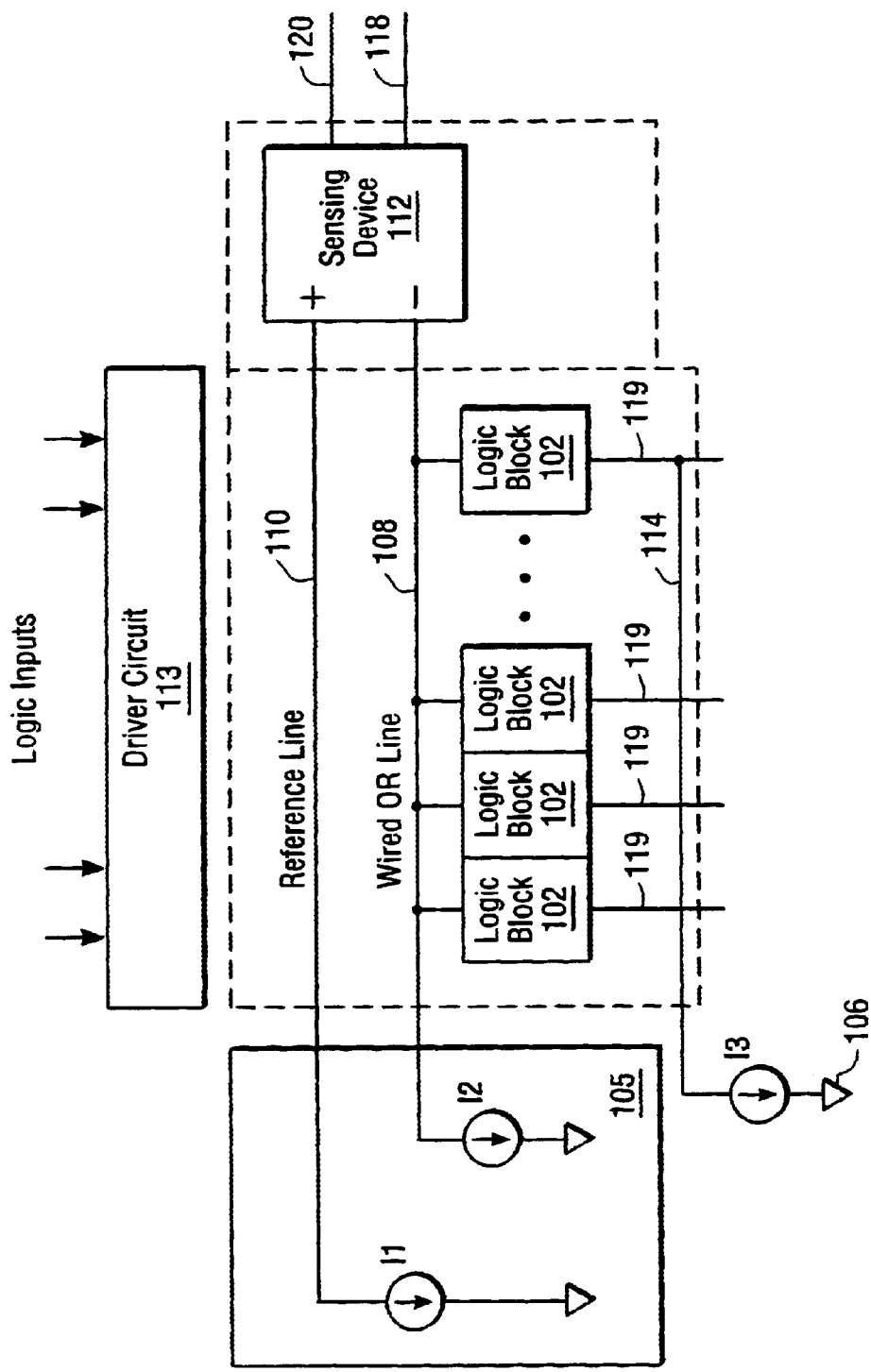
FIG. 2 a block diagram of a first embodiment of a low power wired OR circuit employing the principles of the present invention.

Referring now to FIG. 2, a block diagram of a first embodiment of a low power wired logic circuit 200 in accordance with the present invention is shown. In the embodiment of FIG. 2, the logic circuit 200 is shown as a wired OR circuit. Those of ordinary skills in the art would recognize that the wired logic circuit can also be a wired NOR circuit or any other type of logic depending upon the application.

Low power wired OR circuit 200 comprises a plurality of logic blocks 102, a differential pair of lines, such as a wired OR signal line 108 and a reference line 110, and a sensing device 112. One of ordinary skills in the art would recognize that sensing device 112 could be any circuit or a combination of circuits capable of sensing the difference between two or more signals. For example, sensing device 112 of this embodiment is shown as a current mode differential sense amplifier. In this embodiment, reference line 110 runs parallel to signal line 108.

Each logic block 102 is coupled to a driver circuit 113 to receive an input signal. The driver circuit 113 is well-known in the art and thus will not be described herein. Each logic block 102 comprises a logic circuit (not shown), an example of which is shown below in connection with FIGS. 4 and 5. Each logic circuit in turn comprises a plurality of logic gates (not shown). It should be understood that the present invention is not limited to any particular logic circuit or logic gate in the logic block 102, but may be utilized with any logic circuit or gate requiring a wired OR function. When asserting a signal on signal line 108, each logic block 102 connects signal line 108 to a common return line 114. As a result, line 108 drops more current than reference line 110. Sensing device 112 is coupled to the reference line 110 and the wired OR signal line 108 to receive the wired OR signal and the reference signal respectively and to detect a difference between the two signals. Sensing device 112 outputs a first signal on signal line 120 indicating the difference between the two signals. A more detailed implementation of sensing device 112 is shown below in FIG. 3. Common current return line 114 is coupled to each individual block 102 to connect the blocks 102 to common current source I3.

The conventional pre-charge circuit 104 is replaced with a current reference circuit 105 that provides controlled discharge currents for the wired OR line 108 and the reference line 110. Pre-charge circuit 105 further comprises a pair of current sources I1 and I2. The combination of a current mode sensing device 112 and current precharge circuit 105 determines the value of a signal provided on signal line 120 based on the current differential between the wired OR line 108 and reference line 110. In one embodiment, the current sources I1 and I2 and current source I3 are designed so that I2 is less than I1 and the sum of I2 and I3 is greater than I1. Detecting a valid differential between the reference signal and the wired OR signal before wired OR signal line 108 is fully discharged to ground is advantageous because it reduces voltage swing on the wired OR signal line 108, thereby reducing power dissipation.

In one embodiment, as shown in FIG. 2, reference line 110 provides a positive input to sensing device 112 and wired OR 108 provides a negative input to sensing device 112. In another embodiment (not shown), reference line 110 provides a negative input to sensing device 112 and wired OR 108 provides a positive input to sensing device 112. In one embodiment, if any of the logic blocks 102 provides a current path 119 from the wired OR line 108 to the return line 114, the sensing device 112 asserts a logic zero on signal line 120. Otherwise, sensing device 112 asserts a logic one on signal line 120.

Adding the common current return line 114 presents an advantage because the discharge rate on wired OR 108 does not depend upon the number of logic blocks 102 trying to discharge line 108, but is limited by the current source I3.

Figure 3:
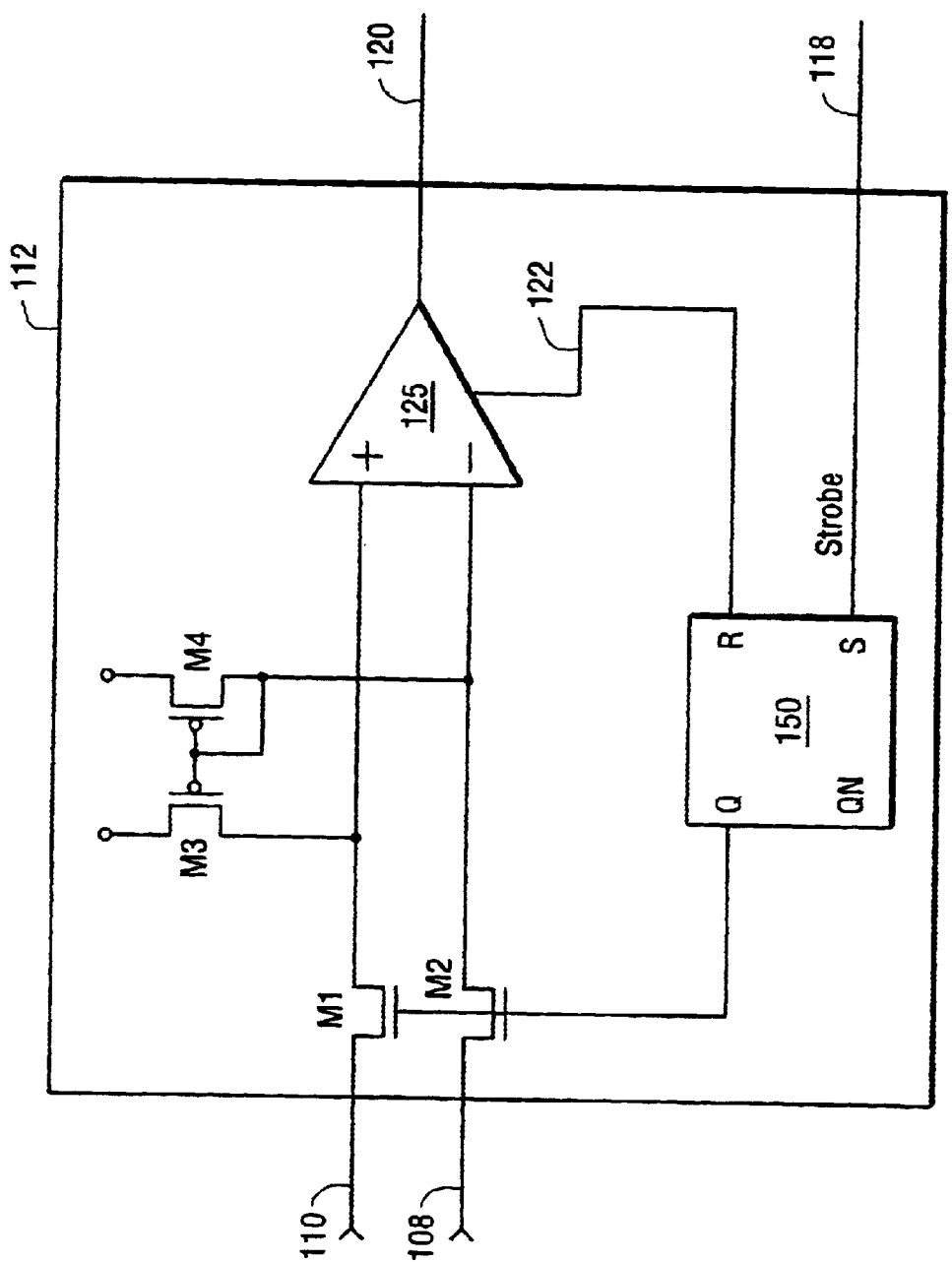
FIG. 3 is a block diagram of one embodiment of a sensing device shown in FIG. 2.

Referring now to FIG. 3, a block diagram of a preferred implementation of the sensing device 112 shown. Sensing device 112 preferably comprises a sense amplifier 125, a pair of differential signal lines 108, 110 providing inputs to the sense amplifier 125, and a flip-flop 150.

Sense amplifier 125 is coupled to receive a wired OR signal on signal line 108 and a to receive a reference signal on signal line 110 and to detect a difference between the two signals. One of ordinary skills in the art would recognize that sense amplifier 125 could be any circuit or a combination of circuits capable of sensing the difference between two or more signals. Transistors M3 and M4 form a current mirror for current to voltage conversion. Transistors M3 and M4 are coupled to reference line 110 and wired OR 108 respectively by a pair of switches M1 and M2. M1 and M2 are coupled to disconnect the reference line 110 and wired OR line 108 as soon as a valid difference between the signals on signal lines 108, 110 is detected on signal line 122. This will minimize the voltage swing on the wired OR line 108 and reference line 110 as well as minimize the power consumption in the wired OR circuit 200. The switches M1 and M2 are shown as FET transistors in FIG. 3, but could comprise any electronic circuit that can be configured to act as a switch. A switch can be a combination of one or more transistors and/or capacitors configured to provide switching functionality. Flip-flop 150 is coupled to receive an output of sense amplifier 125 and to latch the output. Flip-flop 150 as shown in FIG. 3 can be implemented as an R-S flip-flop or any other circuit for latching signals.

Initially, flip-flop 150 has the following states: S=R=0 and Q=0. As a result, M1 and M2 are off. Wired OR line 108 and reference line 110 are connected to current sources I1 and I2 (shown in FIG. 2). When applying strobe signal 118 to flip-flop 150, S transitions to 1, R remains 0, and Q transitions to 1. As a result, M1 and M2 are on. When asserting a signal on the wired OR signal line 108, each logic block 102 (shown in FIG. 2) connects signal line 108 to the return line 114 (shown in FIG. 2). As a result, signal line 108 drops more current than the reference line 110. As soon as sense amplifier 125 detects a valid current difference (above a predetermined threshold) between the wired OR line 108 and the reference line 110, and before the two lines 108, 110 have dissipated a predetermined amount of power, sense amplifier 125 asserts a first signal on signal line 120. The threshold can be determined empirically for each circuit implementing the present invention. The first signal provided on signal line 120 has on its output either 0 or 1 based on the direction of difference between a plus input and a minus input. In one embodiment of the present invention, the output on signal line 120 is 1 when the positive input is greater than the negative input, and the output on signal line 120 is 0 when the negative input is greater than the positive input. In another embodiment of the present invention, the output on signal line 120 is 1 when the negative input is greater than the positive input, and the output on signal line 120 is 0 when the positive input is greater than the negative input.

Sense amplifier 125 also asserts a second signal on signal line 122 indicating that valid differential is detected. The second signal, which is referred herein as "difference detected" signal, has on its output a logic one. Flip-flop 150 receives the output provided on signal line 122 on its R input. Now flip-flop 150 has the following states: S=0, R=1, and Q=0. Flip-flop 150 outputs a low signal on its Q output, which in turn turns M1 and M2 off. As a result, M1 and M2 disconnect wired OR line 108 and reference line 110 so that wired OR line 108 does not discharge any further, thereby reducing power dissipation.

Thus, low power wired OR circuit 200 in accordance with the present invention provides several advantages. For example, it reduces power dissipation by preventing wired OR line 108 from further discharge because once signal differential 122 is detected, M1 and M2 are turned off to stop current discharge. Further, each logic block 102 is connected to common return path 114 and discharges to ground 106 via a common current source. This is advantageous because the discharge rate of wired OR 108 becomes independent of the number of logic blocks 102 trying to discharge wired OR line 108.

Figure 4:
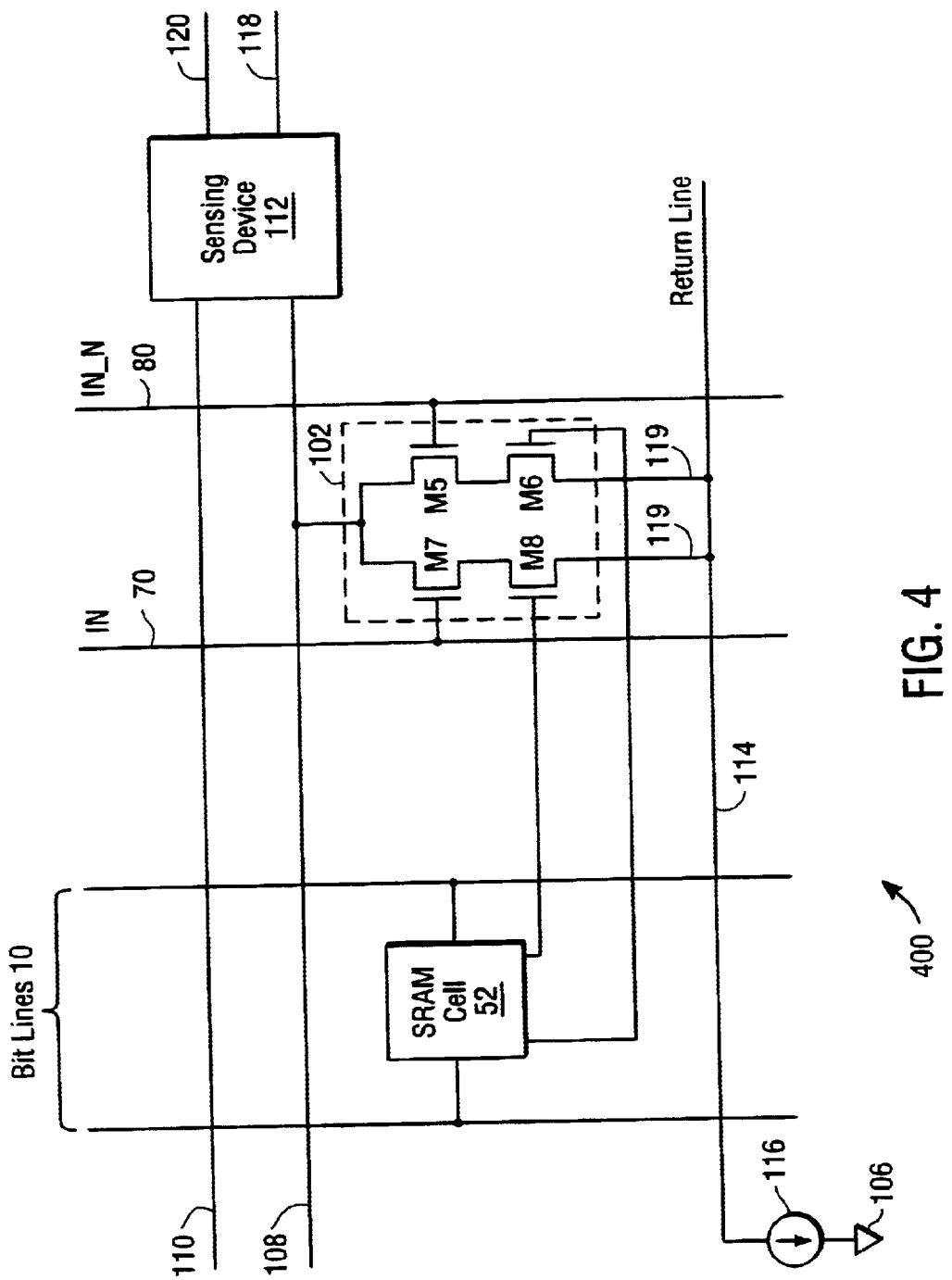
FIG. 4 is a diagram of a CAM cell modified for the low power wired OR circuit, as described in FIG. 2.

Referring now to FIG. 4, it shows a modified CAM cell 400 having a low power wired OR circuit. One of ordinary skills in the art would recognize that a CAM device (not shown) comprises a plurality of CAM cells 400, but only one CAM cell 400 is discussed herein for purposes of clarity. In the example used to describe the present invention, CAM cell 400 comprises circuit 102, which in turn comprises transistors M5–M8 for pulling wired OR signal line 108 low in response to certain conditions. Bit lines 10 are used to read and write data to and from SRAM cell 52. Input signals provided on signal lines 70 and 80 represent search input data that is compared to data stored in SRAM cell 52. To compare the bits stored in SRAM cell 52 to the corresponding $n^{th}$ bit of the input signal provided on signal line 70, wired OR signal line 108 is precharged from ground 106 to a predetermined level. Transistors M5–M8 perform comparisons between the input signals provided on signal lines 70, 80 and the $n^{th}$ bit stored in SRAM 52. When the $n^{th}$ bit of the input signal and a corresponding stored $n^{th}$ bit are not equal, transistors M5–M8 pull signal line 108 low, thereby dissipating power.

In accordance with an embodiment of the present invention, in the modified CAM cell 400, reference line 110 is added to reduce power dissipation and to provide noise immunity. Reference line 110 is shown parallel to signal line 108 in this embodiment. Further, sensing device 112 is coupled to wired OR signal line 108 to receive a wired OR signal. Sensing device is also coupled to reference line 110 to receive a reference signal. When asserting a signal on wired OR signal line 108, M5–M8 connect signal line 108 to signal line 114. As a result, signal line 108 drops more current than the reference line 110. Sensing device 112 detects a difference between the reference signal and the wired OR signal and asserts an output on signal line 120 indicating the difference between the two signals. A preferred implementation of sensing device 112 is discussed above in connection with FIG. 3.

In the modified CAM cell 400, the ground paths 119 are disconnected from ground 106 at the base of transistors M5–M8 and become connected to common return line 114 and to ground 106 via current source 116. This beneficially allows signal line 108 to be discharged at the controlled rate determined by current source 116 regardless of the number of transistors trying to discharge wired OR line 108.

CAM cell technology is further described in U.S. Pat. No. 5,999,435, which is incorporated herein by reference in its entirety. One of skilled in the art would recognize that signal line 108 runs through all CAM cells 400 in a typical CAM device (not shown) so that each logic circuit 102 is connected to the same signal line 108 in the CAM device comprising a plurality of CAM cells 400.

Figure 5:
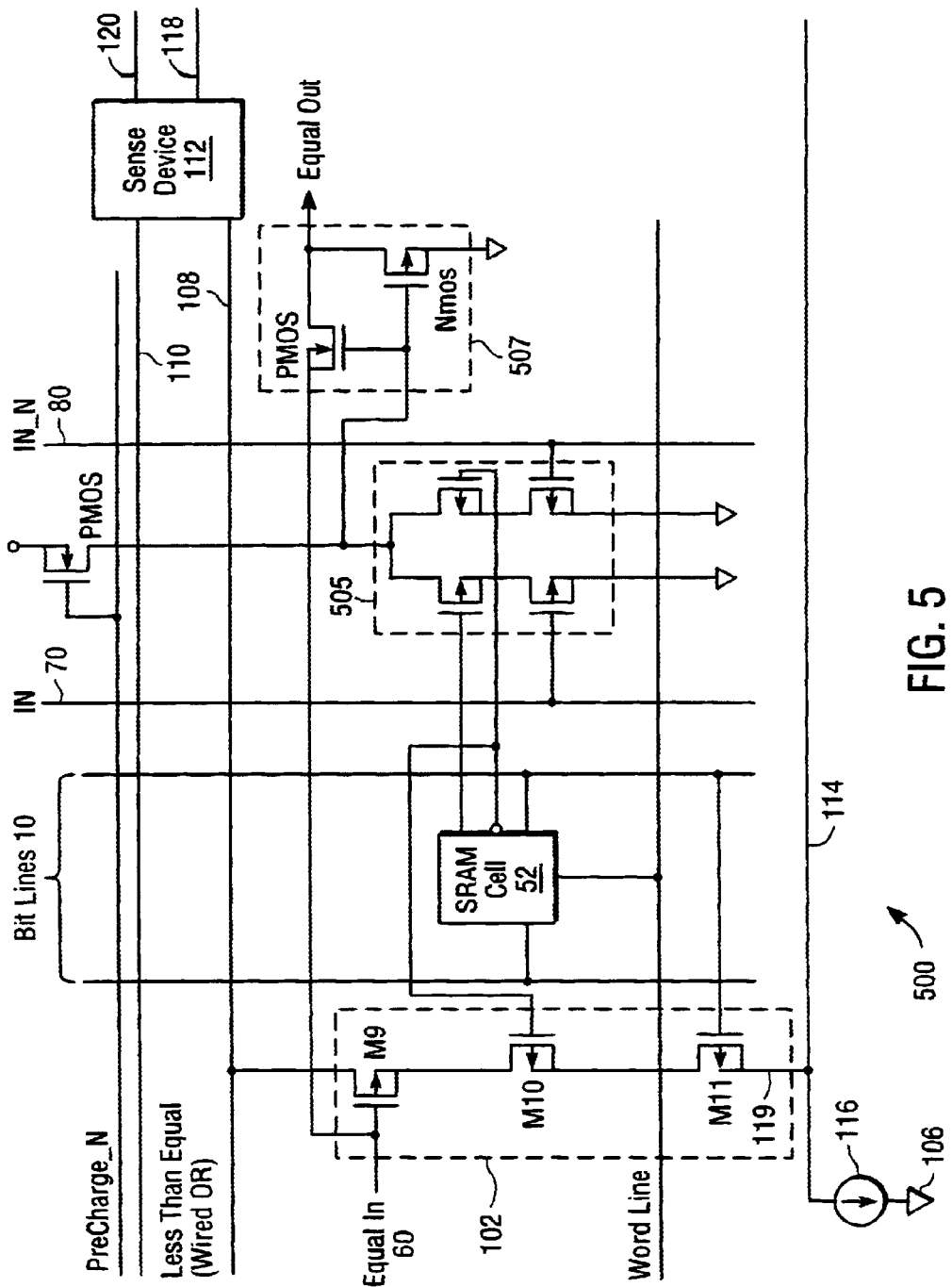
FIG. 5 is a diagram of a BAM cell modified for the low power wired OR circuit, as described in FIG. 2.

Referring now to FIG. 5, it shows a "less than" circuit of a modified BAM cell 500 having a low power wired OR circuit. One of ordinary skills in the art would recognize that a BAM device comprises a plurality of BAM cells 500, but only one BAM cell 500 is discussed herein for purposes of clarity. In the example used to describe the present invention, the modified BAM cell 500 further comprises circuit 102, which in turn comprises transistors M9–M11 for pulling wired OR signal line 108 low in response to comparisons performed in the BAM cell 500. Bit lines 10 are used to read and write data to and from SRAM cell 52. Input data is provided on signal lines 70, 80. Transistors M9–M11 perform an AND function. M9 receives Equal in signal on signal line 60. Equal in signal indicates that in all the previous comparisons performed in preceding BAM cells 500, the input signal provided on signal lines 70, 80 was equal to the corresponding MSB stored in SRAM 52. M10 receives an inverted output of SRAM cell 52. M11 receives an input signal on signal line 70.

In the modified BAM cell, reference line 110, which in this embodiment is shown parallel to signal line 108, is added to reduce power dissipation and to provide noise immunity. Further, sensing device 112 is coupled to signal line 108 to receive a wired OR signal. Sensing device 112 is also coupled to reference line 110 to receive a reference signal. When asserting a signal on wired OR signal line 108, M9–M11 connect signal line 108 to signal line 114. As a result, signal line 108 drops more current than the reference line 110. Sensing device 112 detects a difference between the reference signal and the wired OR signal and asserts a first output on signal line 120 indicating the difference between the two signals. Sensing device 112 further asserts a second output on signal line 122 indicating that the difference is detected. A preferred implementation of sensing device 112 is discussed above in connection with FIG. 3.

Furthermore, the ground path 119 is disconnected at the base of transistors M9–M11 and connected to common return line 114. Common return line 114 connects transistors M9–M11 to ground 106 via current source 116. This beneficially allows signal line 108 to be discharged at a controlled rate determined by current source 116 regardless of the number of transistors trying to discharge signal line 108. It should be understood that in a BAM device (not shown), transistors M9–M11 in each BAM cell 500 are connected to common return path 114 and to ground 106 through the current source 116. One of skilled in the art would also recognize that wired OR signal line 108 runs through all BAM cells 500 in a BAM device (not shown) so that each logic circuit 102 is connected to the signal line 108 in a BAM device comprising a plurality of BAM cells 500.

BAM cell technology is further described in more detail in copending U.S. patent application Ser. No. 10/005,986, entitled "Boundary Addressable Memory" by Alex E. Henderson and Walter E. Croft, which application was filed Nov. 7, 2001 and which application is incorporated herein by reference in its entirety.

Figure 6:
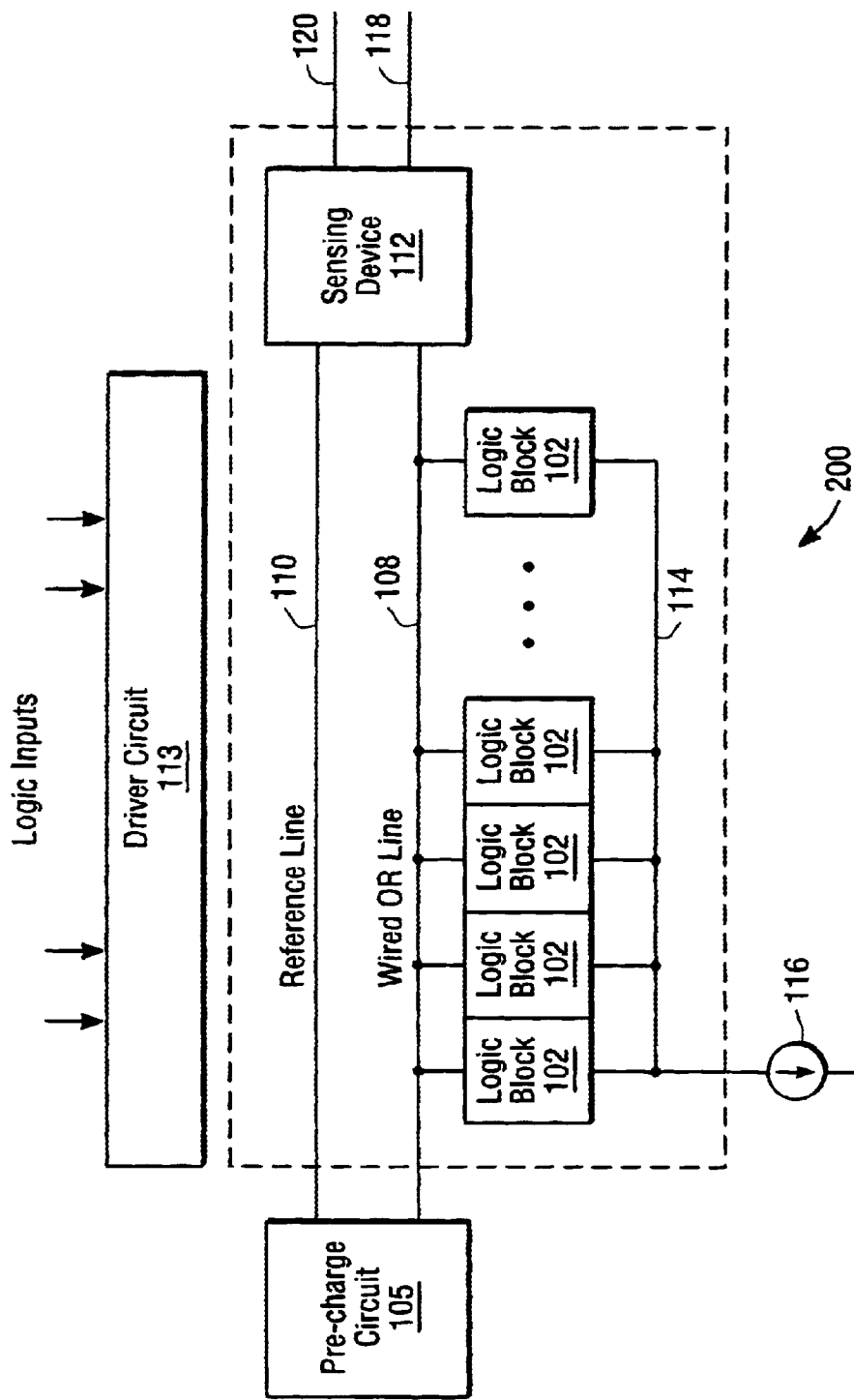
FIG. 6 is a block diagram of the low power wired OR circuit in accordance with another embodiment of the present invention.

FIG. 6 is a high-level diagram of a second embodiment of low power wired OR circuit 200. The embodiment of the low power wired OR circuit 200 is similar to the embodiment shown in FIG. 2, and therefore like reference numerals are used to reference like parts for ease of understanding. In addition to functionality described above in connection with FIG. 2, this embodiment uses a pre-charge voltage circuit 105 for pre-charging the wired OR line 108 and the reference line 110 to predetermined values. In this embodiment, the sensing device 112 is shown as a voltage mode sense amplifier coupled to respond to the differential in the discharge voltage between the wired OR 108 and reference line 110 and to output signal 120 indicating a direction of the difference between wired OR 108 and reference line 110. The voltage swing between reference line 110 and wired OR line 108 may be within 200 mV.

Figure 7:
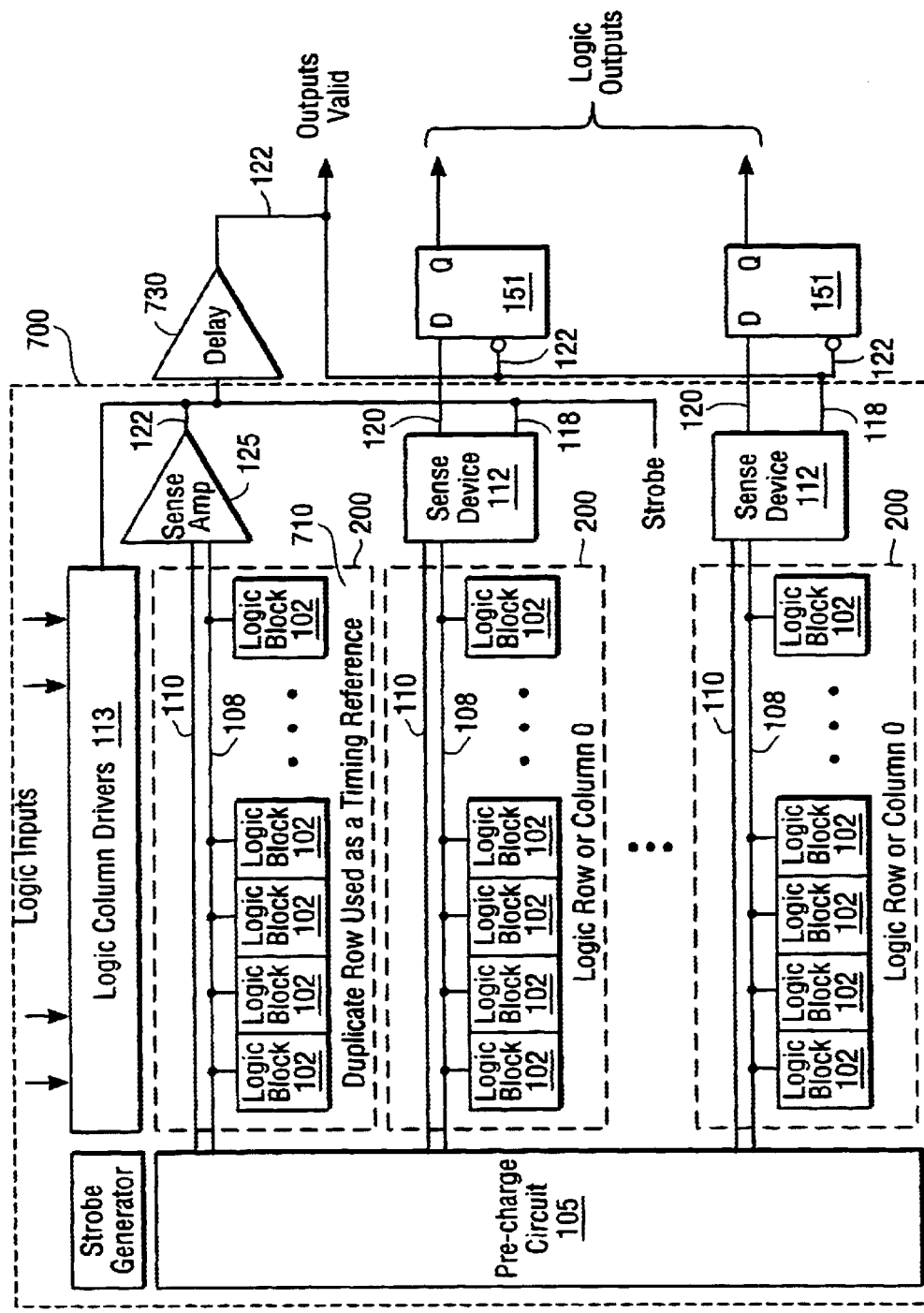
FIG. 7 is a block diagram of an array of the low power wired OR circuits having a duplicate row that provides a timing reference.

FIG. 7 is a block diagram of an array 700 of low power wired OR circuits 200 having a duplicate row 710 that provides a timing reference. FIG. 8 is a timing diagram of the array 700. The embodiment of the low power wired OR circuit 200 shown in FIG. 7 is similar to the embodiment shown in FIG. 2, and therefore, like reference numerals are used to reference like parts for ease of understanding. In addition to functionality described above in connection with FIG. 2, in this embodiment duplicate row 710 is used as a timing reference to determine when to turn off discharge circuits M1 and M2 shown in FIG. 3 to disable a discharge function on wired OR signal line 108.

Initially, the wired OR line 108 and reference line 110 are precharged to predetermined values with the wired OR 108 being precharged at a slightly higher voltage. Column drivers are enabled by asserting Column_Enable signal on column drivers 113 and Wired OR circuits 200 start performing a compare operation. This leads to the discharge process for all wired OR circuits 200 and the duplicate timing row 710. When the sensing device 125 for the duplicate row 710 detects a change between the reference line 110 and wired OR line 108, the sensing device 125 asserts a signal on signal line 122. This output is used to turn off the discharge function on wired OR signal line 108 in all wired OR circuits 200, including the duplicate row 710. Signal line 122 is also coupled to delay 730, which delays the output of the sensing device 125 and outputs a valid signal. Output provided on signal line 122 is also used to clock flip-flop 151 to latch the valid signal 120 and to assert valid logic outputs.

What is claimed is:

1. An apparatus for reducing power dissipation, comprising:
   a logic circuit having an output;
   a wired OR signal line, coupled to the output of the logic circuit;
   a reference line for receiving a reference signal; and
   a sensing device having a first input, a second input and an output, the first input coupled to the reference signal line for receiving the reference signal and the second input coupled to the wired OR signal line for receiving a wired OR signal, the sensing device detecting a difference between the reference signal and the wired OR signal and outputting a signal.

2. The apparatus of claim 1, further comprising a circuit for pre-charging the wired OR signal line.

3. The apparatus of claim 2, wherein the circuit is a voltage mode pre-charge circuit.

4. The apparatus of claim 2, wherein the circuit is a current source mode pre-charge circuit.

5. The apparatus of claim 1, further comprising a latch having inputs and outputs, a first input for receiving the signal and a second input for receiving a clock/strobe signal, for latching the signal in response to the clock-strobe signal, and an output for providing a discharge control signal disabling the wired OR signal line from further discharge.

6. The apparatus of claim 5, wherein the latch is a flip-flop.

7. The apparatus of claim 1, further comprising a common source, coupled to the logic circuit, for controlling the transition speed of the wired OR signal line.

8. A method for reducing power dissipation, comprising:
   pre-charging a wired OR line to a first predetermined value;
   pre-charging a reference line to a second predetermined value;
   detecting a predetermined difference between the wired OR line and the reference line;
   responsive to detecting the predetermined difference, outputting a signal indicating the predetermined difference between the wired OR line and the reference line; and
   discontinuing a discharge of the wired OR line in response to the signal.

9. The method of claim 8, further comprising:
   receiving a clock/strobe signal;
   latching the signal in response to the clock/strobe signal; and
   outputting a discharge control signal disabling the wired OR line from further discharge in response to the latched signal.

10. An apparatus for reducing power dissipation, comprising:
    a logic circuit having an output;
    a wired OR signal line, coupled to the output of the logic circuit;
    a reference line for receiving a reference signal;
    a sensing device having a first input, a second input and an output, the first input coupled to the reference signal line for receiving the reference signal and the second input coupled to the wired OR signal line for receiving a wired OR signal, the sensing device detecting a difference between the reference signal and the wired OR signal and outputting a signal; and
    a common source, coupled to the logic circuit, for controlling a transition speed of the wired OR signal line.

11. An apparatus for reducing power dissipation, comprising:
    first pre-charging means for precharging a wired OR line to a first predetermined value;
    second pre-charging means for precharging a reference line to a second predetermined value;
    sensing means for sensing a predetermined difference between the wired OR line and the reference line;
    outputting means for outputting a signal indicating the predetermined difference between the wired OR line and the reference line, responsive to detecting the predetermined difference; and
    switching means for discontinuing a discharge of the wired OR line in response to the signal.

12. The apparatus of claim 1, further comprising a memory cell coupled with the logic circuit.

13. The apparatus of claim 12, wherein the memory cell comprises a SRAM cell.

14. The method of claim 8, wherein a number of logic circuits are coupled with the wired OR line, the method further comprising:
    each of the logic circuits, when asserting a signal on the wired OR line, coupling the wired OR line to a common return line.

15. The method of claim 14, wherein the common return line is coupled with a common current source.

16. The apparatus of claim 10, further comprising a circuit for pre-charging the wired OR signal line.

17. The apparatus of claim 16, wherein the circuit is a voltage mode pre-charge circuit.

18. The apparatus of claim 16, wherein the circuit is a current source mode pre-charge circuit.

19. The apparatus of claim 10, further comprising a latch having inputs and outputs, a first input for receiving the signal and a second input for receiving a clock/strobe signal, for latching the signal in response to the clock-strobe signal, and an output for providing a discharge control signal disabling the wired OR signal line from further discharge.

20. The apparatus of claim 19, wherein the latch is a flip-flop.

21. The apparatus of claim 10, further comprising a memory cell coupled with the logic circuit.

22. The apparatus of claim 21, wherein the memory cell comprises a SRAM cell.

23. The apparatus of claim 11, further comprising:
    means for receiving a clock/strobe signal;
    means for latching the signal in response to the clock/strobe signal; and
    means for outputting a discharge control signal disabling the wired OR line from further discharge in response to the latched signal.

24. The apparatus of claim 11, further comprising:
    a number of logic circuits coupled with the wired OR line, each of the logic circuits including means for coupling the wired OR line to a common return line when asserting a signal on the wired OR line.

25. The apparatus of claim 24, wherein the common return line is coupled with a common current source.

* * * * *